(12) United States Patent
Hiroi et al.

(10) Patent No.: US 8,445,175 B2
(45) Date of Patent: May 21, 2013

(54) COMPOSITION CONTAINING HYDROXYLATED CONDENSATION RESIN FOR FORMING RESIST UNDERLAYER FILM

(75) Inventors: Yoshiomi Hiroi, Toyama (JP); Takahiro Kishioka, Toyama (JP); Rikimaru Sakamoto, Toyama (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 555 days.

(21) Appl. No.: 12/308,566

(22) PCT Filed: Jun. 15, 2007

(86) PCT No.: PCT/JP2007/062142
§ 371 (c)(1),
(2), (4) Date: Dec. 18, 2008

(87) PCT Pub. No.: WO2007/148627
PCT Pub. Date: Dec. 27, 2007

(65) Prior Publication Data
US 2009/0317740 A1    Dec. 24, 2009

(30) Foreign Application Priority Data

Jun. 19, 2006  (JP) .................................. 2006-168294

(51) Int. Cl.
| G03F 7/09 | (2006.01) |
| G03F 7/11 | (2006.01) |
| G03C 1/76 | (2006.01) |
| G03C 1/825 | (2006.01) |
| G03C 1/815 | (2006.01) |

(52) U.S. Cl.
USPC ...................... 430/271.1; 430/270.1; 430/908

(58) Field of Classification Search
None
See application file for complete search history.

(56) References Cited

U.S. PATENT DOCUMENTS

| 5,780,582 | A * | 7/1998 | Wang et al. ................. 528/365 |
| 7,425,399 | B2 * | 9/2008 | Kishioka et al. ........... 430/270.1 |
| 7,595,144 | B2 * | 9/2009 | Kishioka et al. ............. 430/311 |
| 7,632,626 | B2 * | 12/2009 | Sakamoto ..................... 430/311 |
| 7,790,356 | B2 * | 9/2010 | Kishioka et al. ............. 430/311 |
| 7,846,638 | B2 * | 12/2010 | Kishioka et al. ........... 430/270.1 |
| 2005/0261458 | A1 * | 11/2005 | Guo et al. ...................... 528/112 |
| 2008/0038678 | A1 | 2/2008 | Kishioka et al. |

FOREIGN PATENT DOCUMENTS

| EP | 1 666 972 A1 | 6/2006 |
| EP | 1 757 986 A1 | 2/2007 |
| JP | A-08-325481 | 12/1996 |
| JP | 2005-99138 | * 4/2005 |
| WO | WO 2004/034148 A1 * | 4/2004 |
| WO | WO 2004/034435 A2 | 4/2004 |
| WO | WO 2005/098542 A1 | 10/2005 |
| WO | WO 2006/040918 A1 | 4/2006 |
| WO | WO 2006/040922 A1 | 4/2006 |
| WO | WO 2006/049045 A1 * | 5/2006 |
| WO | WO2006/115074 A1 * | 11/2006 |

OTHER PUBLICATIONS

Derwent English abstract for JP2005-99138.*
Machine-assisted English translation of JP2005-99138 provided by JPO.*
Schmaljohann et al., "Design Strategies for 157 nm Single-Layer Photoresists: Lithographic Evaluation of a Poly($\alpha$-trifluoromethyl vinyl alcohol) Copolymer," Proceedings of SPIE, 2000, vol. 3999, pp. 330-334.
Crawford et al., "New Materials for 157 nm Photoresists: Characterization and Properties," Proceedings of SPIE, 2000, vol. 3999, pp. 357-364.
Patterson et al., Polymers for 157 nm Photoresist Applications: A Progress Report, Proceedings of SPIE, 2000, vol. 3999, pp. 365-374.
European Search Report issued in corresponding European Patent Application No. 07745397.5, dated Dec. 4, 2009.

* cited by examiner

Primary Examiner — Sin J. Lee
(74) Attorney, Agent, or Firm — Oliff & Berridge, PLC

(57) ABSTRACT

Disclosed is a lithographic composition for forming a resist underlayer film, which can be used as a lower layer antireflection film by which an exposure light striking on a photoresist formed on a semiconductor substrate is inhibited from being reflected from the substrate in a lithographic process of manufacturing semiconductor equipment, a planarization film for flattening a semiconductor substrate having a rugged surface used in order to fill in a hole formed on the semiconductor substrate, a film which prevents a photoresist from being contaminated by a substance generated from a semiconductor substrate during heating/burning, or the like. The lithographic composition for forming a resist underlayer comprises a polymer having a structure of formula (1):

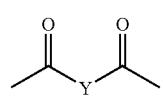

(1)

(where Y represents a $C_{1-10}$ alkylene group or a $C_{6-14}$ aromatic ring, provided that the alkylene group and the aromatic ring have one or more hydroxyl group(s) being not larger than the number of the replaceable hydrogen atom of the alkylene group and the aromatic ring); and a solvent.

8 Claims, No Drawings

COMPOSITION CONTAINING HYDROXYLATED CONDENSATION RESIN FOR FORMING RESIST UNDERLAYER FILM

TECHNICAL FIELD

The present invention relates to a novel lithographic composition for forming a resist underlayer film, an underlayer film formed from the composition, and a method for forming a photoresist pattern using the underlayer film.

In addition, the present invention relates to a lithographic resist underlayer film and a composition for forming a resist underlayer film for forming the underlayer film being usable as, a lower layer antireflection film by which an exposure light striking on a photoresist formed on a semiconductor substrate is inhibited from being reflected from the substrate in a lithographic process of manufacturing semiconductor equipment, a planarization film for flattening a semiconductor substrate having a rugged surface used in order to fill in a hole formed on the semiconductor substrate, a film which prevents a photoresist from being contaminated by a substance generated from a semiconductor substrate during heating/burning, or the like.

BACKGROUND ART

In the manufacturing of semiconductor devices, microprocessing by lithography using a photoresist composition has been carried out heretofore. The micro-processing is a processing method including forming a thin film of a photoresist composition on a silicon wafer, irradiating actinic rays such as ultraviolet rays through a mask pattern on which a pattern for a semiconductor device is depicted, developing it, and etching the silicon wafer using the obtained resist pattern as a protective film. However, in recent years, high integration of semiconductor devices is progressed, and actinic rays used also tend to become shorter wavelength from i-ray (a wavelength of 365 nm) and KrF excimer laser (a wave length of 248 nm) to ArF excimer laser (a wavelength of 193 nm). Along with this change, influences of random reflection of actinic rays from a substrate and standing wave have become serious problems. Accordingly, a method providing an anti-reflective film (bottom anti-reflective coating) between the photoresist and the substrate, has been widely studied.

For example, a composition for forming an anti-reflective film containing polymers having a pyrimidinetrione structure, an imidazolidinedione structure, an imidazolidinetrione structure or a triazinetrion structure has been suggested (see Patent Document 1).

In addition, it is suggested that a quaternary phosphonium salt as a cure catalyst is contained in a resin composition containing tris(β-methylglycidyl) isocyanurate and a carboxyl group containing resin (see Patent Document 2)
[Patent Document 1]
WO 05/098542 Pamphlet
[Patent Document 2]
Japanese Patent Application Publication No. JP-A-8-325481 (1996)

DISCLOSURE OF THE INVENTION

Problems to be Solved by the Invention

It is an object of the present invention to provide a composition for forming a resist underlayer film usable for manufacturing semiconductor equipment. And also, to provide a lithographic resist underlayer film and a composition for forming a resist underlayer film for forming the underlayer film which do not cause intermixing with a photoresist applied and formed as an upper layer and have high dry etching rate compared with the photoresist.

Moreover, another object of the present invention is to provide a lithographic composition for forming a resist underlayer film for forming a resist underlayer film having excellent filling property for holes on a semiconductor substrate.

In addition, still another object of the present invention is to provide a lithographic resist underlayer film and a composition for forming a resist underlayer film for forming the resist underlayer film being usable as, a lower layer antireflection film by which an exposure light, in particular ArF excimer laser (a wavelength of 193 nm), striking on a photoresist formed on a semiconductor substrate is inhibited from being reflected from the substrate in a lithographic process for manufacturing semiconductor equipment; a planarization film for flattening a semiconductor substrate having a rugged surface; a film which prevents a photoresist from being contaminated by a substance generated from a semiconductor substrate during heating/burning; or the like. And also, to provide a method for forming a lithographic resist underlayer film using the composition for forming a resist underlayer film, and a method for forming a photoresist pattern.

Means for Solving the Problems

According to a first aspect of the present invention, a lithographic composition for forming a resist underlayer film including a polymer having a structure represented by following formula (1):

[Chemical Formula 1]

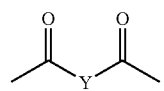

(1)

(where Y represents a $C_{1-10}$ alkylene group or a $C_{6-14}$ aromatic ring, provided that the alkylene group and the aromatic ring have one or more hydroxyl group(s) being not larger than the number of the replaceable hydrogen atoms of the alkylene group and the aromatic ring); and a solvent;

according to a second aspect, the lithographic composition for forming a resist underlayer film according to the first aspect, in which the polymer has a structure represented by formula (2):

[Chemical Formula 2]

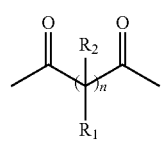

(2)

(where n represents a number of repeating unit(s) of 1 to 10, and each $R_1$ and $R_2$ is a functional group selected from a group consisting of a hydroxyl group, a hydrogen atom, a $C_{1-6}$ alkyl group, a phenyl group, a naphthyl group, a nitro group, a cyano group and a halogen group, and a total number of hydroxyl groups of $R_1$ and $R_2$ is 1 or more and 2n or less);

according to a third aspect, the lithographic composition for forming a resist underlayer film according to the first aspect, in which the polymer has a structure represented by formula (3):

[Chemical Formula 3]

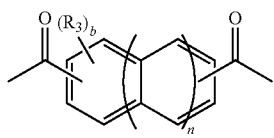

(3)

(where n is an integer of 0 to 2; b is an integer of 1 to (2n+4), and $R_3$ is a substitution group of a ring and each $R_3$ is a functional group selected from a group consisting of a hydroxyl group, a $C_{1-6}$ alkyl group, a phenyl group, a naphthyl group, a nitro group, a cyano group and a halogen group, and a total number of hydroxyl groups of $R_3$ is 1 or more and (2n+4) or less);

according to a fourth aspect, the lithographic composition for forming a resist underlayer film according to the first aspect, in which the polymer has a structure represented by formula (4):

[Chemical Formula 4]

(4)

$$\left(-CH_2-\overset{OH}{\underset{|}{CH}}-CH_2-Q-CH_2-\overset{OH}{\underset{|}{CH}}\cdot CH_2-O-\overset{O}{\underset{\|}{C}}\overset{R_2}{\underset{R_1}{\bigg)_n}}\overset{O}{\underset{\|}{C}}-O\right)_m$$

(where n represents a number of repeating unit(s) of 1 to 10; each $R_1$ and $R_2$ is a functional group selected from a group consisting of a hydroxyl group, a hydrogen atom, a $C_{1-6}$ alkyl group, a phenyl group, a naphthyl group, a nitro group, a cyano group and a halogen group; a total number of hydroxyl groups of $R_1$ and $R_2$ is 1 or more and 2n or less; and m represents a number of repeating units of 3 to 1000; Q represents formula (5), formula (6), formula (7), formula (8), formula (9) or formula (10):

[Chemical Formula 5]

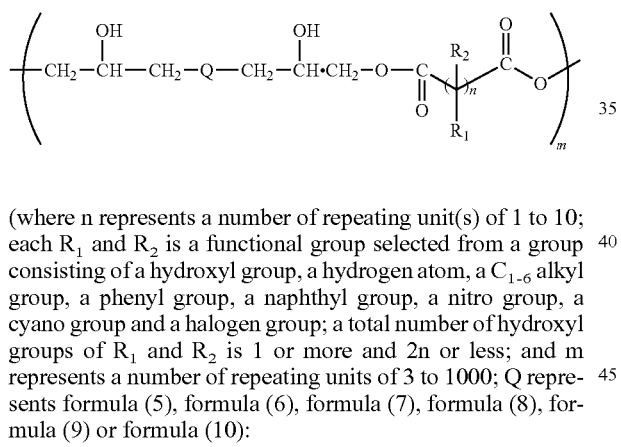

-continued (8)

(9) —O—(CH₂)ₖ—O—

(10)

(where $R_3$ is a substitution group of a ring and each $R_3$ is a $C_{1-6}$ alkyl group, a $C_{1-6}$ alkoxy group, a $C_{3-6}$ alkenyl group, a halogen group, a nitro group, a cyano group, a hydroxyl group or a $C_{1-6}$ alkylthio group; $T_1$ is an integer of 1 to 4; $T_2$ is an integer of 1 to 10; $T_3$ is an integer of 1 to 6; $T_4$ is an integer of 1 to 8; and k is an integer of 1 to 10; $X_1$ represents formula (11), formula (12) or formula (13):

[Chemical Formula 6]

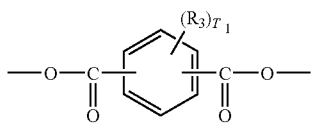

(where each $R_4$ to $R_7$ represents a hydrogen atom, a $C_{1-6}$ alkyl group, a $C_{3-6}$ alkenyl group, a benzyl group, or a phenyl group; the phenyl group may be substituted with a group selected from a group consisting of a $C_{1-6}$ alkyl group, a halogen atom, a $C_{1-6}$ alkoxy group, a nitro group, a cyano group, a hydroxyl group and a $C_{1-6}$ alkylthio group; $R_4$ and $R_5$, and, $R_6$ and $R_7$ may be bonded to each other to form a $C_{3-6}$ ring; $R_8$ represents a hydrogen atom, a $C_{1-6}$ alkyl group, a $C_{3-6}$ alkenyl group, a benzyl group, or a phenyl group; and the phenyl group may be substituted with a group selected from a group consisting of a $C_{1-6}$ alkyl group, a halogen atom, a $C_{1-6}$ alkoxy group, a nitro group, a cyano group, a hydroxyl group and a $C_{1-6}$ alkylthio group)));

according to a fifth aspect, the lithographic composition for forming a resist underlayer film according to the first aspect, in which the polymer has a structure represented by formula (14):

[Chemical Formula 7]

(14)

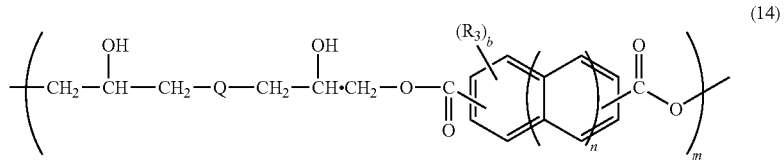

(where n is an integer of 0 to 2; b is an integer of 1 to (2n+4); m represents a number of repeating units of 3 to 1000; $R_3$ is a substitution group of a ring, and each $R_3$ is a functional group selected from a group consisting of a hydroxyl group, a $C_{1-6}$ alkyl group, a phenyl group, a naphthyl group, a nitro group, a cyano group and a halogen group; and a total number of hydroxyl groups of $R_3$ is 1 or more and (2n+4) or less. Q is the same as Q in the formula (4));

according to a sixth aspect, the lithographic composition for forming a resist underlayer film according to the first aspect, in which the polymer has a structure represented by following formula (15):

[Chemical Formula 8]

(15)

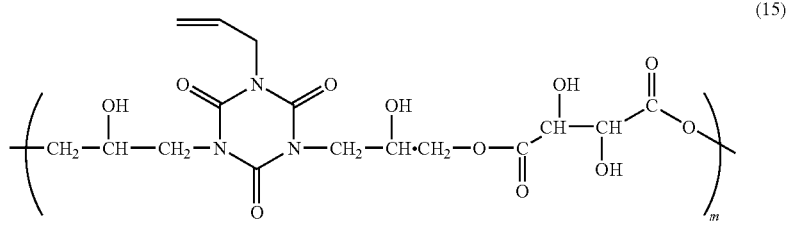

(where m represents a number of repeating units of 3 to 1000);

according to a seventh aspect, the lithographic composition for forming a resist underlayer film according to the first aspect, in which the polymer has a structure represented by following formula (16):

[Chemical Formula 9]

(16)

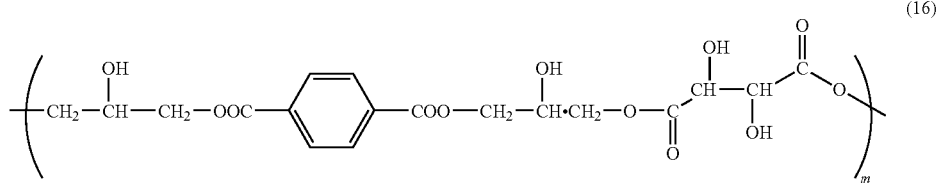

(where m represents a number of repeating units of 3 to 1000);

according to an eighth aspect, the lithographic composition for forming a resist underlayer film according to any one of the first to sixth aspects, further including a crosslinking agent;

according to a ninth aspect, the lithographic composition for forming a resist underlayer film according to any one of the first to sixth aspects, further including an acid compound and/or an acid-generating agent; and according to a tenth aspect, a method for forming a photoresist pattern used for manufacturing of semiconductor equipment including; forming a resist underlayer film by applying the lithographic composition for forming a resist underlayer film according to any one of the first to sixth aspects on a semiconductor substrate and burning it; forming a photoresist layer on the resist underlayer film; exposing the semiconductor substrate coated with the resist underlayer film and the photoresist layer; and developing the photoresist layer after exposure.

Effects of the Invention

The present invention is a composition for forming a resist underlayer film having an absorption in short wavelength light, in particular ArF excimer laser (a wavelength of 193 nm). The obtained resist underlayer film effectively absorbs reflected light from a substrate.

According to the present invention, a resist underlayer film effectively absorbing reflected light from a semiconductor substrate in micro-processing which uses short wavelength light, in particular ArF excimer laser (a wavelength of 193 nm), not causing intermixing with a photoresist layer, being able to be easily removed by dry etching compared with the photoresist layer can be provided. In addition, according to the present invention, a resist underlayer film being suitable for use along with a hard mask, can be provided.

Moreover, by using a resist underlayer film according to the present invention, a well shaped photoresist pattern can be formed in a lithography process using short wavelength light.

BEST MODES FOR CARRYING OUT THE INVENTION

A lithographic composition for forming a resist underlayer film according to the present invention includes a polymer having repeating unit(s) represented by the formula (1) and a solvent.

In addition, a lithographic composition for forming a resist underlayer film according to the present invention can further include a crosslinkable compound, an acid compound and an acid-generating agent as optional components to the polymer and the solvent. Moreover, other components such as a surfactant and a rheology controlling agent can be included.

For a composition for forming a resist underlayer film according to the present invention, a polymer having a structure according to the formula (1) is an essential component. A ratio of the polymer having a structure according to the formula (1) constituting a solid content in the composition for forming a resist underlayer film according to the present invention is more than 50% by mass, preferably more than 60% by mass, for example 50 to 100% by mass, 60 to 99% by mass, or 70 to 95% by mass, from the viewpoint of an anti-reflection effect. Although there is no particular limitation as long as each component being uniformly dissolved in a solvent, a ratio of the solid content in the composition for forming a resist underlayer film according to the present invention is, for example 1 to 50% by mass, 5 to 30% by mass, or 10 to 25% by mass. Here, the term "solid component" means that the solvent component is subtracted from the total component in the lithographic composition for forming a resist underlayer film.

In the polymer having the structure according to the formula (1), Y represents a $C_{1-10}$ alkylene group or a $C_{6-14}$ aromatic ring.

The $C_{6-14}$ aromatic ring includes a benzene ring, a naphthalene ring and an anthracene ring.

At least one hydroxyl group exists in a part of the above-described Y. A number of hydroxyl groups is one or more, and the hydroxyl groups can exist up to the maximum number of replaceable hydrogen atoms of the alkylene group and the aromatic ring.

A polymer having a structure according to the formula (2) is included as a specific structure of the polymer having the structure according to the formula (1).

In the formula (2), n represents a number of repeating unit(s) of 1 to 10, and each $R_1$ and $R_2$ is a functional group selected from a group consisting of a hydroxyl group, a hydrogen atom, a $C_{1-6}$ alkyl group, a phenyl group, a naphthyl group, a nitro group, a cyano group and a halogen group, and a total number of hydroxyl groups of $R_1$ and $R_2$ is 1 or more and 2n or less. Specific examples of an alkyl group in $R_1$ and $R_2$ include a methyl group, an ethyl group, an isopropyl group, a normal-butyl group and a normal-hexyl group, and for a halogen group, a fluorine atom, a chlorine atom, a bromine atom and an iodine atom are used. For example, 1 or 2 hydroxyl group(s) can exist in case of a methylene group, and 1 to 12 hydroxyl group(s) can exist in case of a hexylene group.

In the formula (2), a part of repeating units including $R_1$ and $R_2$ as groups is an alkylene group, and this alkylene group is a liner alkylene group such as a methylene group, an ethylene group, a normal-propylene group, a normal-hexylene group, a normal-pentylene group and a normal-octylene group. A $C_{1-4}$ alkylene group is preferable and an ethylene group having a carbon number of 2 is particularly preferable.

A partial structure according to the formula (2) containing these alkylene groups is derived from a liner aliphatic dicarboxylic acid, and as the liner aliphatic dicarboxylic acid, for example, the liner aliphatic dicarboxylic acid exemplified in (1-1) to (1-11):

[Chemical Formula 10]

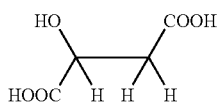
[1-1]

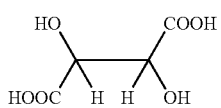
[1-2]

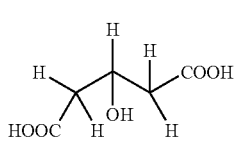
[1-3]

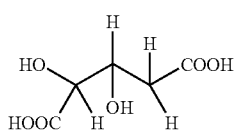
[1-4]

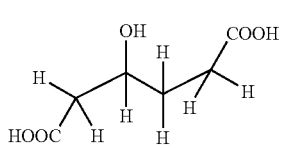
[1-5]

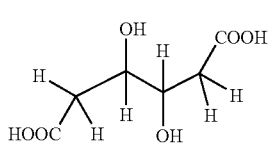
[1-6]

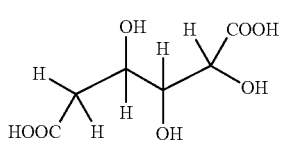
[1-7]

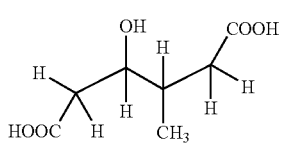
[1-8]

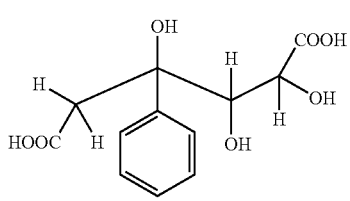
[1-9]

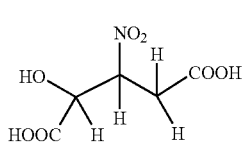
[1-10]

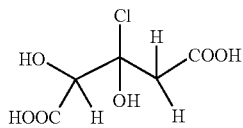

[1-11]

is used as a raw material to obtain the polymer having the structure according to the formula (2).

Although n, which is a number of the repeating unit(s), is 1 to 10, when a total number of hydroxyl groups contained in $R_1$ and $R_2$ is Z, a range of Z is represented by $1 \leq z \leq 2n$. In a resist underlayer film according to a composition for forming a resist underlayer film containing the polymer having the structure according to the formula (2), hydroxyl groups exist more than one because hydroxyl groups are essential in a lithography process in order to increase etching rate. However, since polarity of the obtained polymer become high in the case that a number of hydroxyl groups being close to saturation exist, solubility to a solvent becomes lower. Accordingly, $1 \leq z \leq n$, where a number of n is 1 to 4, is preferable. Particularly, a polymer having the structure according to the formula (2) using a dicarboxylic acid derived from tartaric acid is preferable.

In addition, a polymer having a structure according to the formula (3) is included as a specific structure of the polymer having the structure according to the formula (1).

In the formula (3), n is an integer of 0 to 2; the case of n=0 represents a benzene ring; the case of n=1 represents a naphthalene ring; and the case of n=2 represents an anthracene ring. $R_3$ is a substitution group which replaces hydrogen atoms existing in a ring, and this substitution group is a functional group selected from a group consisting of a hydroxyl group, a hydrogen atom, a $C_{1-6}$ alkyl group, a phenyl group, a naphthyl group, a nitro group, a cyano group and a halogen group. A total number of hydroxyl groups in $R_3$ is 1 or more and (2n+4) or less. In $R_3$, specific examples of an alkyl group include a methyl group, an ethyl group, an isopropyl group, a normal-butyl group and a normal-hexyl group, and for a halogen group, a fluorine atom, a chlorine atom, a bromine atom or an iodine atom is used.

A partial structure according to the formula (3) is derived from an aromatic dicarboxylic acid, and as the aromatic dicarboxylic acid, for example, the aromatic dicarboxylic acid exemplified in (2-1) to (2-6):

[Chemical Formula 11]

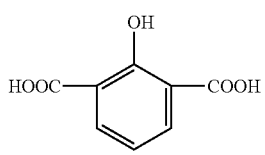

[2-1]

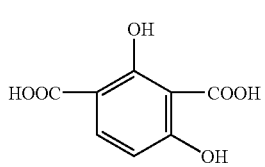

[2-2]

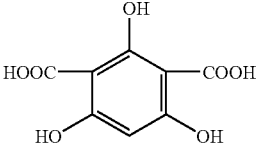

[2-3]

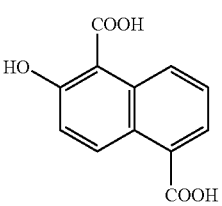

[2-4]

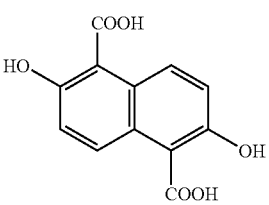

[2-5]

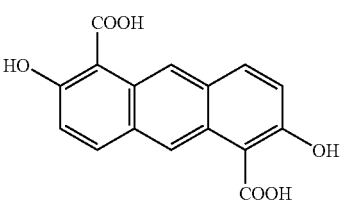

[2-6]

is used as a raw material to obtain the polymer having the structure according to the formula (3).

Although n, which is a number of the repeating unit(s), is 0 to 2, since a number of substitution groups in $R_3$ is 1 to (2n+4), a number of hydroxyl groups based on $R_3$ is 1 to (2n+4). In a resist underlayer film according to a composition for forming a resist underlayer film containing the polymer having the formula (3), hydroxyl groups exist more than one because hydroxyl groups are essential in a lithography process in order to increase etching rate. However, polarity of the obtained polymer become high in the case that a number of hydroxyl groups being close to saturation exist, so that solubility to a solvent becomes lower. Accordingly, in the case of n=0, a number of hydroxyl groups is preferably 1 to 2. Particularly, a polymer having the structure according to the formula (3) using a dicarboxylic acid derived from a hydroxyphthalic acid is preferable.

A polymer according to the formula (4) is included as a specific example of the polymer according to the formula (1).

In the formula (4), n represents a number of repeating unit(s) of 1 to 10, and each $R_1$ and $R_2$ is a functional group selected from a group consisting of a hydroxyl group, a hydrogen atom, a $C_{1-6}$ alkyl group, a phenyl group, a naphthyl group, a nitro group, a cyano group and a halogen group, and a number of hydroxyl groups exist is 1 or more and 2n or less. m represents a number of repeating units of 3 to 1000. In $R_1$ and $R_2$, specific examples of an alkyl group include a methyl group, an ethyl group, an isopropyl group, a normal-butyl group and a normal-hexyl group, and for a halogen group, a fluorine atom, a chlorine atom, a bromine atom or an iodine atom is used.

Q is a bivalent organic group and includes the formula (5), the formula (6), the formula (7), the formula (8), the formula (9) or the formula (10).

In the formula (5) to the formula (8), $R_3$ is a substitution group of a ring and each $R_3$ is a $C_{1-6}$ alkyl group, a $C_{1-6}$ alkoxy group, a $C_{3-6}$ alkenyl group, a halogen group, a nitro group, a cyano group, a hydroxyl group or a $C_{1-6}$ alkylthio group.

Specific examples of an alkyl group include a methyl group, an ethyl group, an isopropyl group, a normal-butyl group and a cyclohexyl group. Specific examples of an alkoxy group include a methoxy group, an ethoxy group, a normal-pentyloxy group, an isopropoxy group and a cyclohexyloxy group. Specific examples of an alkylthio group include a methylthio group, an ethylthio group, a normal-pentylthio group, an isopropylthio group and a cyclohexylthio group. For a halogen atom, a fluorine atom, a chlorine atom, a bromine atom or an iodine atom is used.

In the formula (5) to the formula (8), $T_1$, $T_2$, $T_3$ and $T_4$ are numbers of substitution groups substituted to the ring; $T_1$ is an integer of 1 to 4; $T_2$ is an integer of 1 to 10; $T_3$ is an integer of 1 to 6; and $T_4$ is an integer of 1 to 8.

In the formula (9), k is an integer of 1 to 4, and represents a methylene group, an ethylene group, a propylene group and a butylene group, and a butylene group of k=4 is preferable. These alkylene groups may be substituted with a $C_{1-6}$ alkyl group, a $C_{1-6}$ alkoxy group, a $C_{3-6}$ alkenyl group, a halogen group, a nitro group, a cyano group, a hydroxyl group or a $C_{1-6}$ alkylthio group.

In the formula (10), $X_1$ includes the formula (11), the formula (12) or the formula (13).

In the formula, each $R_4$ to $R_7$ represents a hydrogen atom, a $C_{1-6}$ alkyl group, a $C_{3-6}$ alkenyl group, a benzyl group, or a phenyl group; the phenyl group may be substituted with a group selected from a group consisting of a $C_{1-6}$ alkyl group, a halogen atom, a $C_{1-6}$ alkoxy group, a nitro group, a cyano group, a hydroxyl group and a $C_{1-6}$ alkylthio group; $R_4$ and $R_5$, and, $R_6$ and $R_7$ may be bonded to each other to form a $C_{3-6}$ ring; $R_8$ represents a hydrogen atom, a $C_{1-6}$ alkyl group, a $C_{3-6}$ alkenyl group, a benzyl group, or a phenyl group; and the phenyl group may be substituted with a group selected from a group consisting of a $C_{1-6}$ alkyl group, a halogen atom, a $C_{1-6}$ alkoxy group, a nitro group, a cyano group, a hydroxyl group and a $C_{1-6}$ alkylthio group. Specific examples of an alkyl group include a methyl group, an ethyl group, an isopropyl group, a normal-butyl group and a cyclohexyl group. Specific examples of an alkoxy group include a methoxy group, an ethoxy group, a normal-pentyloxy group, an isopropoxy group and a cyclohexyloxy group. Specific examples of an alkylthio group include a methylthio group, an ethylthio group, a normal-pentylthio group, an isopropylthio group and a cyclohexylthio group. For a halogen atom, a fluorine atom, a chlorine atom, a bromine atom or an iodine atom, is used.

Alkenyl group can be exemplified by (3-1) to (3-3):

[Chemial Formula 12]

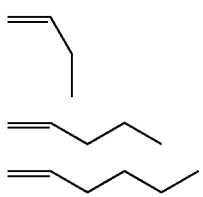

[3-1]

[3-2]

[3-3]

A specific example of a polymer according to the formula (1) used in the present invention is the formula (4), and the polymer according to the formula (4) is obtained by reacting a diepoxy compound with a dicarboxylic acid.

A dicarboxylic acid forms a partial structure according to the formula (2) and the formula (3), and a liner aliphatic dicarboxylic acid is exemplified above as its specific example.

Diepoxy compounds can be exemplified by, for example, (4-1) to (4-16):

[Chemical Formula 13]

[4-1]

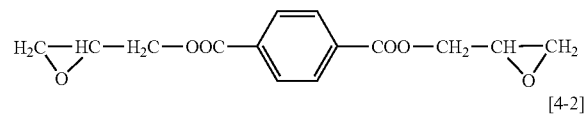

[4-2]

[4-3]

[4-4]

[4-5]

[4-6]

[4-7]

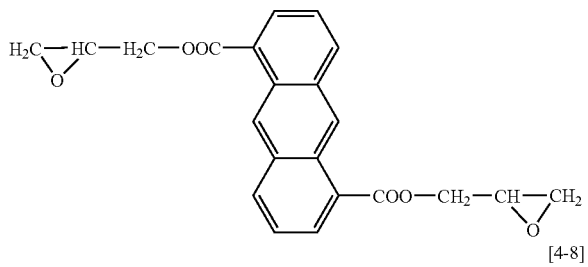

[4-8]

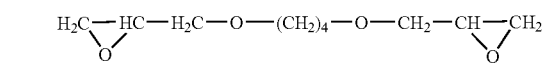

-continued
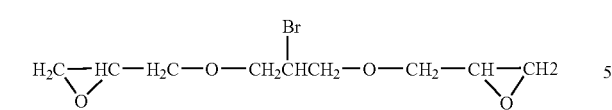
[4-9]
[Chemical Formula 14]
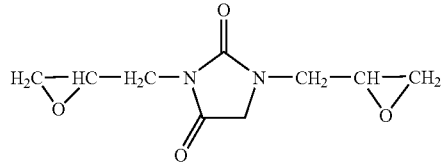
[4-10]
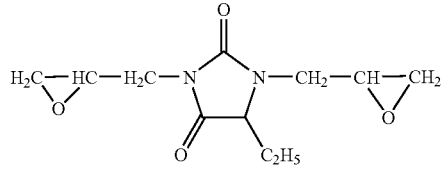
[4-11]
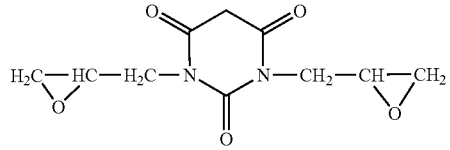
[4-12]
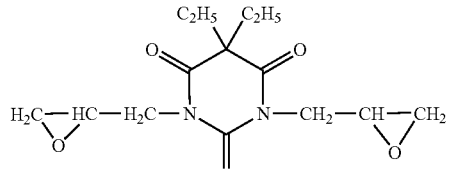
[4-13]
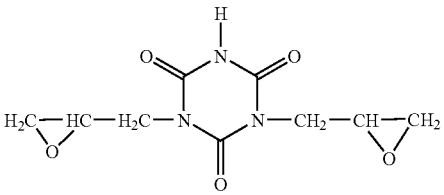
[4-14]
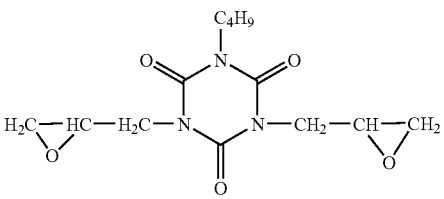
[4-15]
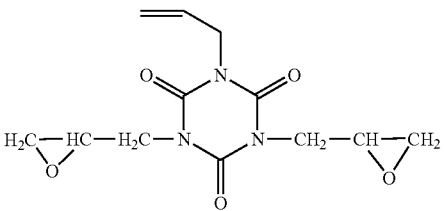
[4-16]
Specific examples of the polymer according to the formula (4) obtained by reaction of a dicarboxylic acid with a diepoxy compound can be exemplified by, for example, (5-1) to (5-25):
[Chemical Formula 15]
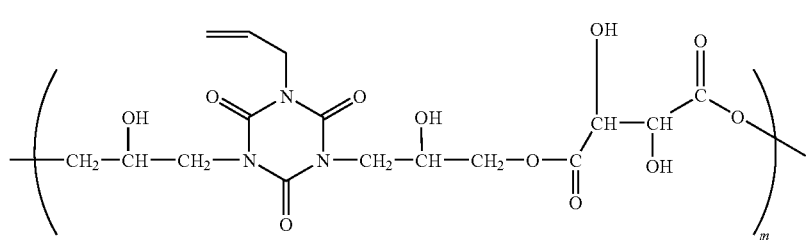
[5-1]
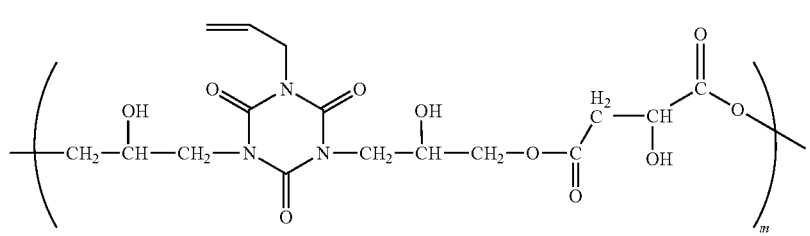
[5-2]

-continued
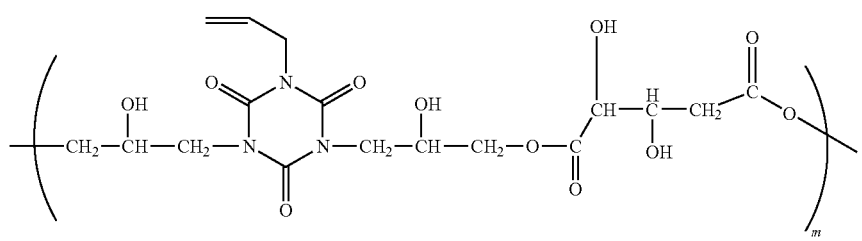
[5-3]
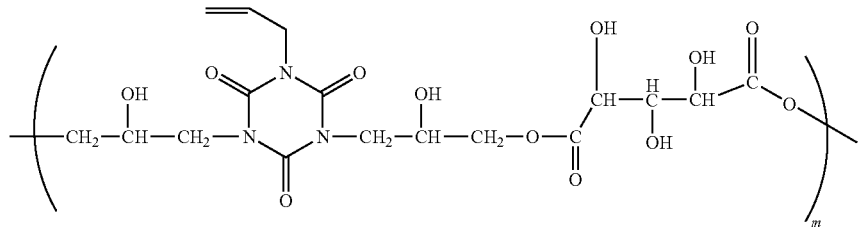
[5-4]
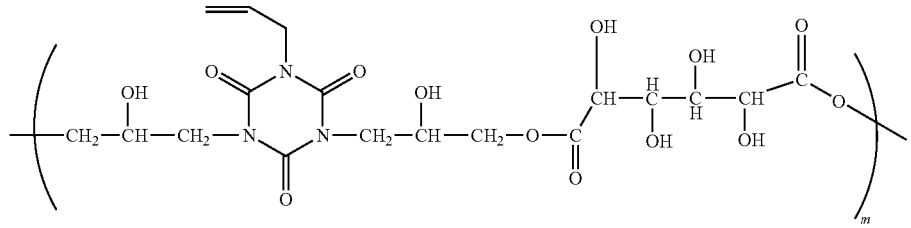
[5-5]
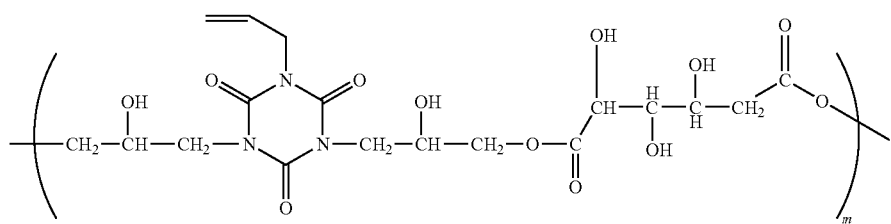
[5-6]
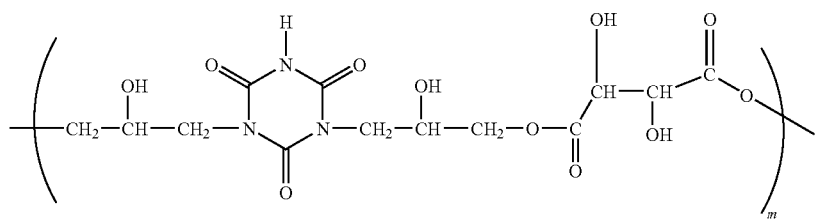
[5-7]
[Chemical Formula 16]
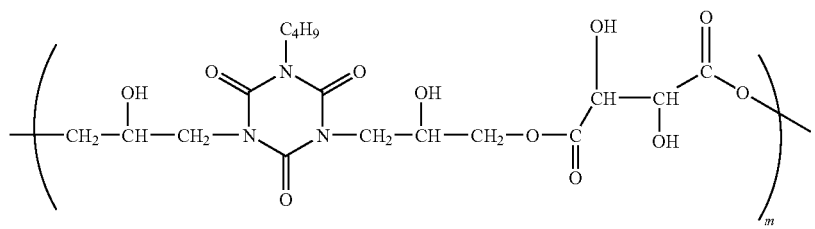
[5-8]

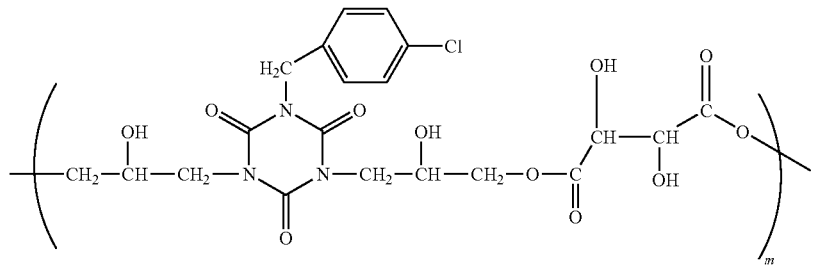
[5-9]
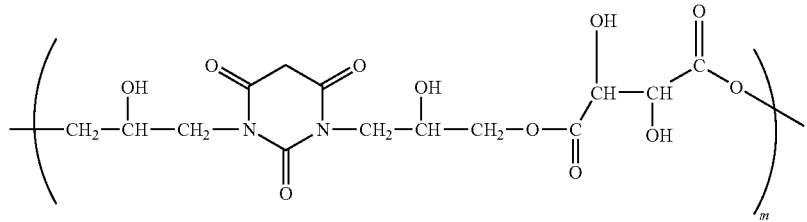
[5-10]
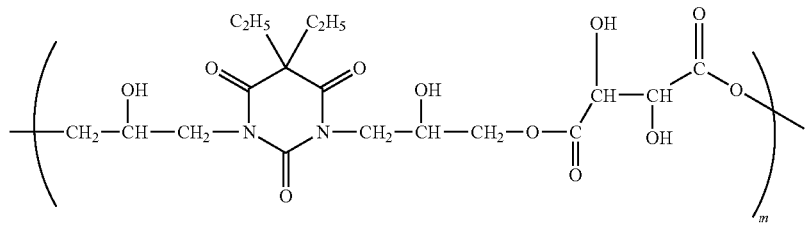
[5-11]
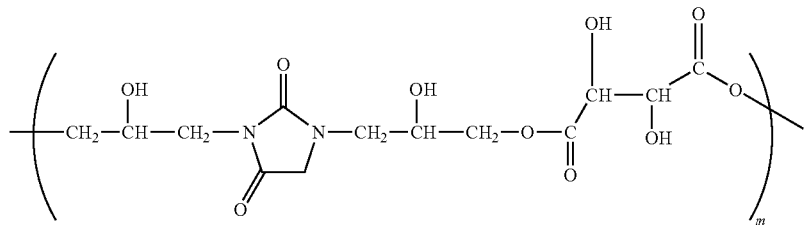
[5-12]
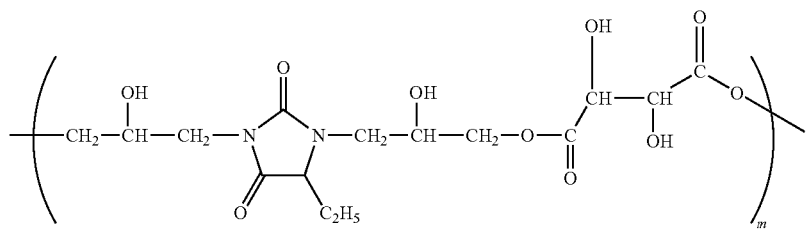
[5-13]
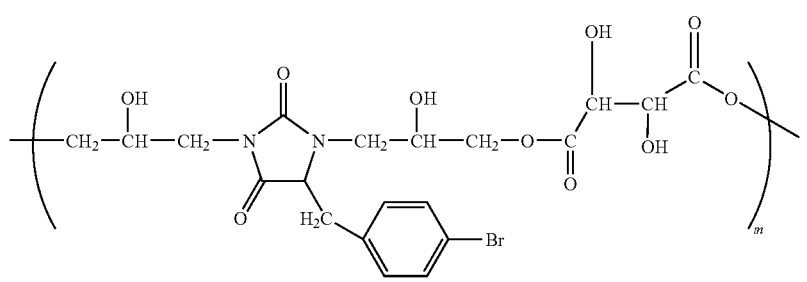
[5-14]

[Chemical Formula 17]
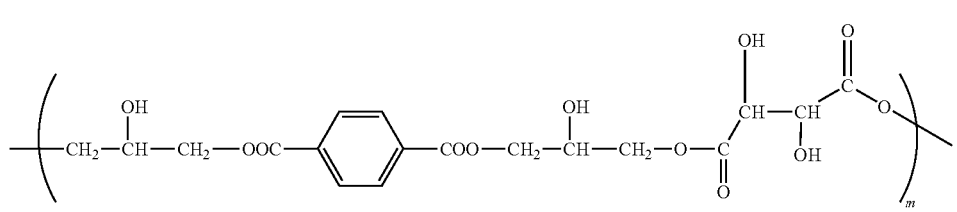
[5-15]
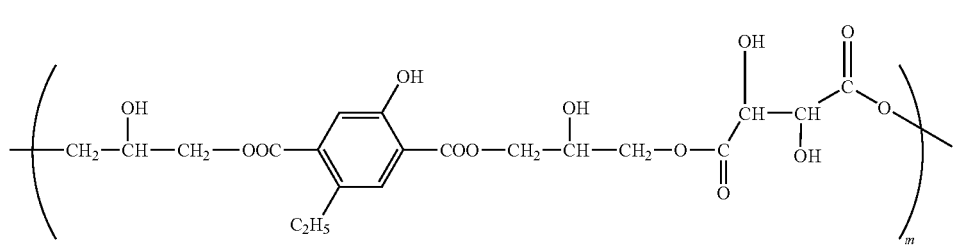
[5-16]
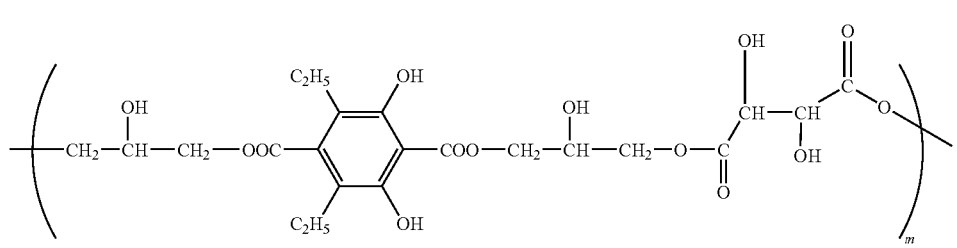
[5-17]
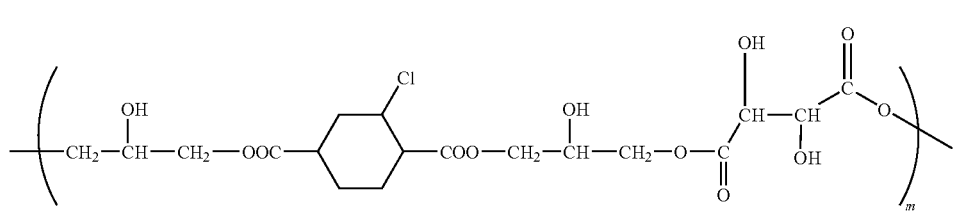
[5-18]
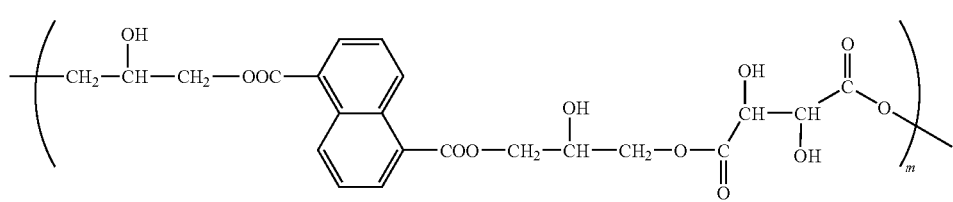
[5-19]
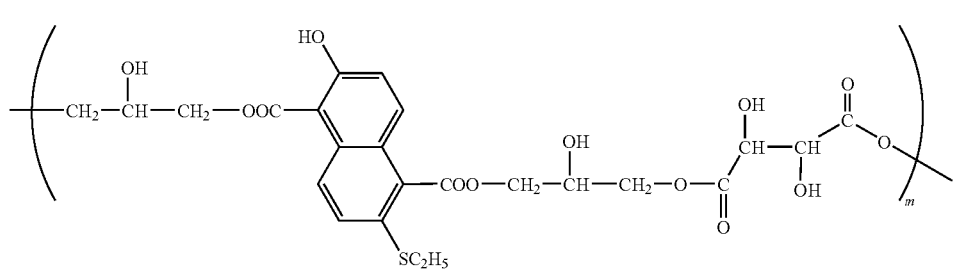
[5-20]

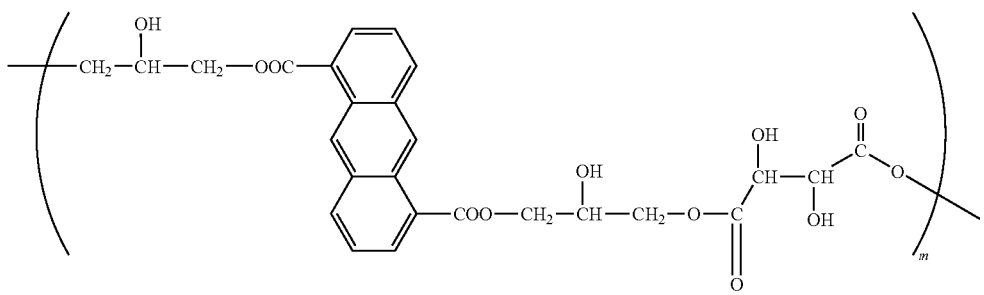

[5-21]

[Chemical Formula 18]

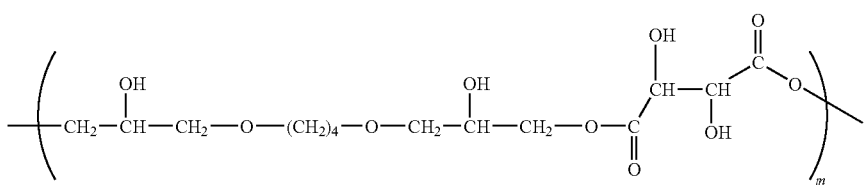

[5-22]

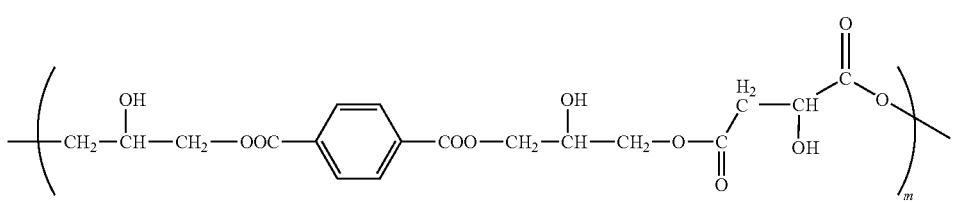

[5-23]

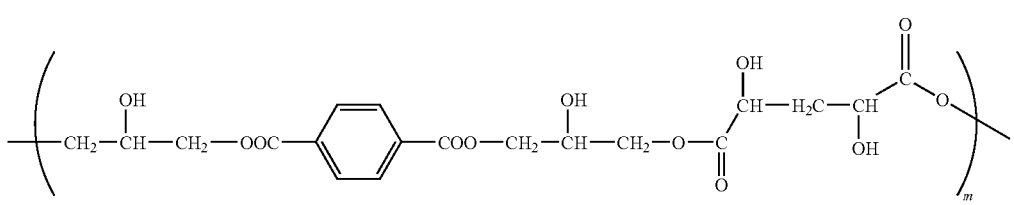

[5-24]

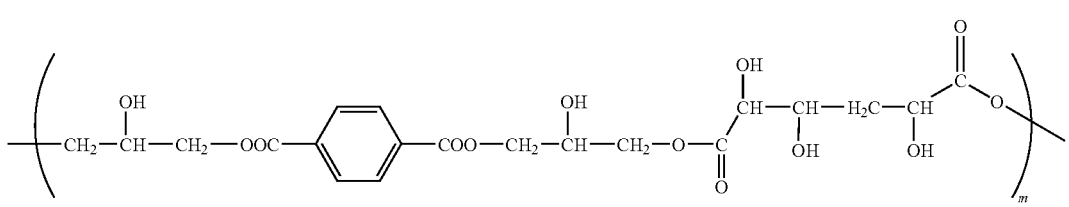

[5-25]

In the polymer according to the formula (4), m, which is repeating units thereof, is 3 to 1000, preferably 3 to 250 and more preferably 10 to 100, and its weight average molecular weight is 1000 to 1,000,000, preferably 1000 to 100,000 and more preferably 2000 to 50,000.

Both terminal groups of the polymer according to the formula (4) are a hydroxyl group or a carboxyl group, and a carboxylic acid is in the side of a carboxyl group and a hydroxyl group is in the side of epoxy.

For the polymer according to the formula (4), a polymer according to the formula (15) and the formula (16) can preferably be used as a more specific polymer, and the polymer according to the formula (15) is particularly preferable.

In addition, in the present invention, a polymer according to the formula (14) can be used as a polymer according to the formula (1). For Q in the polymer according to the formula (14), the Q having the same contents in the formula (4) can be used. n is an integer of 0 to 2. For $R_3$, the same $R_3$ in the formula (3) can be used. b is an integer of 1 to (2n+4), and m, which is repeating units of the polymer according to the formula (14), is 3 to 1000, preferably 3 to 250 and more preferably 10 to 100, and its weight average molecular weight is 1000 to 1,000,000, preferably 1000 to 100,000 and more preferably 2000 to 50,000.

Both terminal groups of the polymer according to the formula (14) are a hydroxyl group or a carboxyl group, and a carboxylic acid is in the side of a carboxyl group and a hydroxyl group is in the side of epoxy.

A polymer according to the formula (14) can be exemplified by, for example, (6-1) to (6-3):

[Chemical Formula 19]

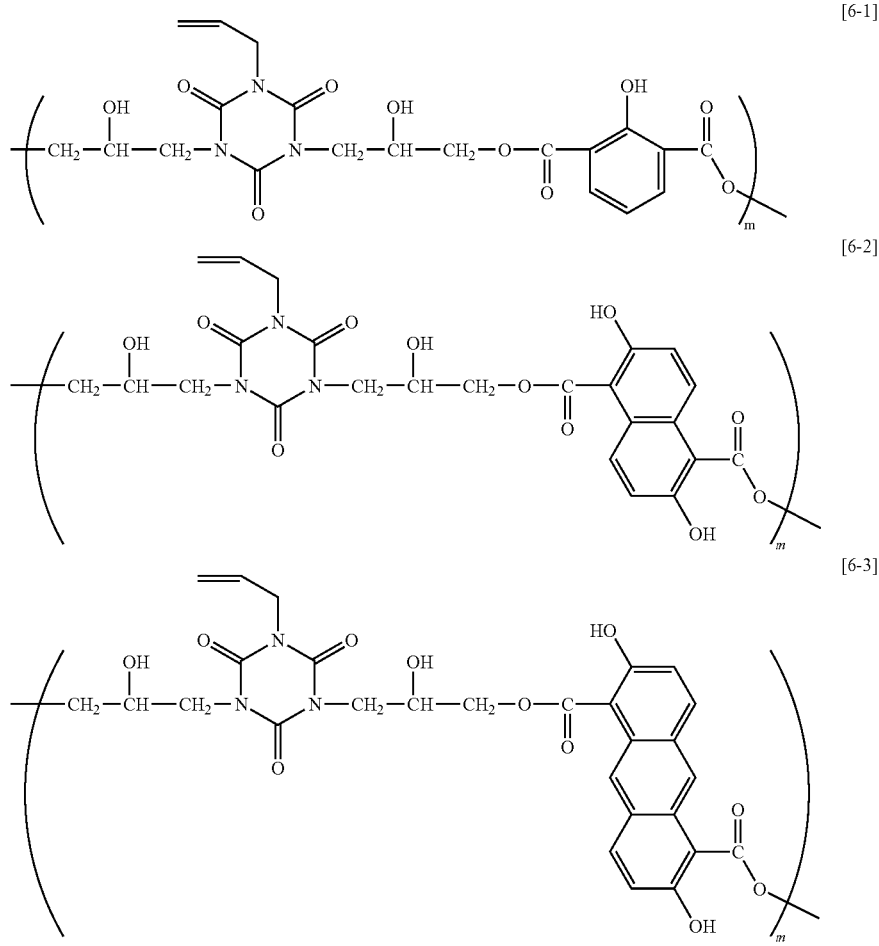

A diepoxy compound and a dicarboxylic acid provide two-dimensional polymer chain elongation by a condensation reaction. These are preferably a bifunctional epoxy compound and a carboxylic acid. When trifunctional compounds are used, gelation may occur in some cases.

In the reaction of a diepoxy compound with a dicarboxylic acid, use of a quaternary phosphonium salt catalyst is preferable, when the dicarboxylic acid is an aliphatic dicarboxylic acid.

In addition, in the reaction of a diepoxy compound with a dicarboxylic acid, both a quaternary phosphonium salt and a quaternary ammonium salt can be used, when the dicarboxylic acid is an aromatic dicarboxylic acid.

A quaternary phosphonium salt used in the reaction of a diepoxy compound with a dicarboxylic acid as a catalyst is represented by formula (17):

In the formula (17), each $R_9$, $R_{10}$, $R_{11}$ and $R_{12}$ represents $C_{1-10}$ alkyl group or $C_{6-14}$ aryl group; P represents a phosphorous atom; $Y^-$ represents anion; and each $R_9$, $R_{10}$, $R_{11}$, and $R_{12}$ is bonded to a phosphorous atom through C—P bonding.

In the formula (17), although $R_9$, $R_{10}$, $R_{11}$ and $R_{12}$ are $C_{1-18}$ alkyl groups or $C_{1-18}$ aryl groups, among organic groups of $R_9$, $R_{10}$, $R_{11}$ and $R_{12}$, a quaternary phosphonium salt in which three organic groups are $C_{6-14}$ aryl groups and other one organic group is a $C_{1-10}$ alkyl group is preferable. An alkyl group includes a methyl group, an ethyl group, a propyl group, a butyl group, an octyl group, or the like, and for an aryl group, for example, a phenyl group or a substituted phenyl group is preferable, and a phenyl group and a tolyl group can be exemplified. In addition, remaining one organic group is preferably a $C_{1-18}$ alkyl group. Moreover, anion ($Y^-$) can include halogen ions such as a chlorine ion ($Cl^-$), a bromine ion ($Br^-$), and an iodine ion ($I^-$), and acid groups such as a carboxylate (—$COO^-$), a sulfonate (—$SO_3^-$) and an alcoholate (—$O^-$). Compounds of this formula (17) can be obtained as commercial products, and include, for example, a halogenated tetra-alkyl phosphoniums such as a halogenated tetra-n-butyl phosphonium and a halogenated tetra-n-propyl phosphonium; halogenated tri-alkyl mono-benzyl phosphoniums such as a halogenated triethyl monobenzyl phosphonium; halogenated triphenyl mono-alkyl phosphoniums such as a halogenated triphenyl monomethyl phosphonium and a halogenated triphenyl monoethyl phosphonium; a halogenated triphenyl monobenzyl phosphonium, a halogenated tetraphenyl phosphonium, a halogenated tritolyl mono-aryl phosphonium or a halogenated tritolyl mono-alkyl phosphonium (a halogen atom is a chlorine atom or a bromine atom). Particularly, halogenated triphenyl mono-alkyl phosphoniums such as a halogenated triphenyl monomethyl phosphonium and a halogenated triphenyl monoethyl phosphonium; a halogenated triphenyl mono-aryl phosphonium such as a halogenated triphenyl monobenzyl phosphonium, a halogenated tritolyl mono-aryl phosphonium such as a halogenated tritolyl monophenyl phosphonium; and a halogenated tritolyl mono-alkyl phosphonium such as a halogenated tritolyl monomethyl phosphonium (a halogen atom is a chlorine atom or a bromine atom) are preferable.

Halogenated triphenyl mono-alkyl phosphoniums have higher reactivity than a halogenated tetra-alkyl phosphoniums. Particularly, a triphenyl monoethyl phosphonium bromide is preferable.

A quaternary ammonium salt used in the reaction of a diepoxy compound with a dicarboxylic acid as a catalyst is represented by formula (18):

$$R_{13}R_{14}R_{15}R_{16}N^+Y^- \qquad (18).$$

Although $R_{13}$, $R_{14}$, $R_{15}$ and $R_{16}$ of a quaternary ammonium salt according to the formula (18) are $C_{1-10}$ alkyl groups or $C_{6-14}$ aryl groups, among organic groups of $R_{13}$, $R_{14}$, $R_{15}$ and $R_{16}$, a quaternary ammonium salt in which three organic groups are $C_{1-10}$ alkyl groups and other one organic group is a $C_{6-14}$ aryl group, is preferable. An alkyl group includes a methyl group, an ethyl group, a propyl group, a butyl group, an octyl group, or the like, and for an aryl group, for example, a phenyl group or a substituted phenyl group is preferable, and a phenyl group and a tolyl group can be exemplified. Moreover, anion ($Y^-$) can include halogen ions such as a chlorine ion ($Cl^-$) a bromine ion ($Br^-$), and an iodine ion ($I^-$), and acid groups such as a carboxylate ($-COO^-$), a sulfonate ($-SO_3^-$) and an alcoholate ($-O^-$). Fore these quaternary ammonium salts, for example, a halogenated tetra-alkyl ammoniums such as a halogenated tetraethyl ammonium, a halogenated tetrabutyl ammonium; a halogenated trioctyl monomethyl ammonium; halogenated tri-alkyl mono-aryl ammoniums such as a halogenated triethyl monophenyl ammonium, a halogenated triethyl monobenzyl ammonium, a halogenated tributyl benzyl ammonium and a halogenated trimethyl benzyl ammonium; and halogenated triaryl mono-alkyl ammoniums such as a halogenated triphenyl monoethyl ammonium and a halogenated tritolyl monomethyl ammonium are exemplified. Particularly, halogenated tri-alkyl mono-aryl ammonium is preferable, and triethyl monophenyl ammonium chloride, triethyl monotolyl ammonium bromide and the like, are exemplified.

In order to obtain a polymer used in the present invention, reaction of a diepoxy compound with a dicarboxylic acid is preformed. This reaction is preformed in a solvent containing a quaternary phosphonium salt or a quaternary ammonium salt at a temperature of 50 to 200° C. under nitrogen gas stream condition for 0.5 to 48 hours. Raw materials in the solvent of a diepoxy compound and a dicarboxylic acid is 5 to 80% by mass in total mass.

Solvents used for this reaction include, for example, propylene glycol monomethyl ether, propylene glycol monomethyl ether acetate, benzene, toluene, xylene, ethyl lactate, butyl lactate, N-methylpyrrolidone, cyclohexane and γ-butyllactone. These solvents can be used singly or as a mixed solvent containing two or more types of solvents.

A halogenated quaternary phosphonium salt or a halogenated quaternary ammonium salt used as a catalyst exists in a reaction solvent containing a generated polymer. These halogenated quaternary phosphonium salt and halogenated quaternary ammonium salt can be removed from the reaction product by contacting the reaction solvent to a cation-exchange resin and an anion-exchange resin alternatively. A cation-exchange resin used here includes, for example, Amberlite 15JWET (trade name) (manufactured by ORGANO CORPORATION) and HCR (trade name) (manufactured by Muromachi Chemical Inc.), and an anion-exchange resin is, for example, 550A (trade name) (manufactured by Muromachi Chemical Inc.) or 650C (trade name) (manufactured by Muromachi Chemical Inc.).

A composition for forming a resist underlayer film according to the present invention can contain a crosslinkable compound. Although such a crosslinkable compound is not particularly limited, a crosslinkable compound having at least two crosslink-forming substitution groups is preferably used. For example, a melamine type compound having a crosslink-forming substitution group such as a methylol group or a methoxymethyl group and a substituted urea compound are included. Specific examples are a compound of methoxymethylated glycolurils or methoxymethylated melamines, and for example, tetramethoxymethyl glycoluril, tetrabutoxymethyl glycoluril or hexamethoxymethyl melamine. In addition, a compound such as tetramethoxymethyl urea or tetrabutoxymethyl urea is included. These crosslinkable compounds can cause a cross-linking reaction by self condensation. Moreover, these crosslinkable compounds can cause a cross-linking reaction with hydroxyl groups in the polymer used in the present invention. By such cross-linking reactions, a formed resist underlayer film becomes stiff, and then becomes the resist underlayer film having low solubility to an organic solvent. Crosslinkable compounds can be used singly or in combination of two or more types thereof.

When a composition for forming a resist underlayer film according to the present invention contains a crosslinkable compound, its content in the solid component is, for example, 1 to 50% by mass or 10 to 40% by mass.

A composition for forming a resist underlayer film according to the present invention can contain an acid compound, an acid-generating agent or a combination thereof. Acid compounds include, for example, sulfonic acid compounds such as p-toluenesulfonic acid, trifluoromethanesulfonic acid and pyridinium-p-toluenesulfonate, and carboxylic acid compounds such as salicylic acid, sulfosalicylic acid, citric acid, benzoic acid and hydroxybenzoic acid. In addition, acid-generating agents include, for example, acid-generating agents generating acid by heat or light such as 2,4,4,6-tetrabromocyclohexadienone, benzoin tosylate, 2-nitrobenzyl tosylate, 2,4-dinitrobenzyl-p-trifluoromethylbenzenesulfonic acid, phenyl-bis(trichloromethyl)-s-triazine and N-hydroxysuccinimide trifluoromethanesulfonate. In addition, iodonium salt type acid-generating agents such as diphenyliodonium hexafluorophosphate, diphenyliodonium trifluoromethanesulfonate and bis(4-tert-butylphenyl)iodonium trifluoromethanesulfonate, and sulfonium salt type acid-generating agents such as triphenylsulfonium hexafluoroantimonate and triphenylsulfonium trifluoromethanesulfonate can be included. For an acid compound, a sulfonic acid compound, and for an acid-generating agent, an iodonium salt type acid-generating agent and a sulfonium salt type acid-generating agent are preferably used. Acid compounds and acid-generating agents can be used singly or in combination of two or more types thereof.

When a composition for forming a resist underlayer film according to the present invention contains an acid compound and an acid-generating agent, as their contents, a content of an acid compound is, for example, 0.001 to 5% by mass or 0.005 to 1% by mass in solid components, and a content of an acid-generating agent is, for example, 0.001 to 5% by mass or 0.005 to 1% by mass in solid components.

A composition for forming a resist underlayer film according to the present invention can contain any component such as other polymers, a light-absorbing compound, a rheology controlling agent and a surfactant, as necessary.

For other polymers, a polymer produced from addition-polymerizable compounds is included. Addition polymerized polymers produced from addition-polymerizable compounds include an acrylic acid ester compound, a methacrylic acid ester compound, an acrylamide compound, a methacrylamide compound, a vinyl compound, a styrene compound, a maleimide compound, maleic anhydride, acrylonitrile, or the like. In addition, as other polymers, for example, a polyester, a polyamide, a polyimide, a polyamic acid, a polycarbonate, a polyether, a phenol-novolac, a cresol-novolac and a naphthol-novolac, are included. When other polymers are used, a used amount thereof is, for example, 0.1 to 40% by mass in solid components.

For a light-absorbing compound, a light-absorbing compound can be used without specific limitation as long as the compound having high absorption capacity to light in a photosensitive characteristic wavelength region of the photosensitive components in the photoresist layer applied on the resist underlayer film. As a light-absorbing compound, for example, a benzophenone compound, a benzotriazole compound, an azo compound, a naphthalene compound, an anthracene compound, an anthraquinone compound, a triazine compound, a triazinetrione compound, a quinoline compound and the like, can be used. A naphthalene compound, an anthracene compound, a triazine compound and a triazinetrione compound are used. For specific examples, for example, 1-naphthalenecarboxylic acid, 2-naphthalenecarboxylic acid, 1-naphthol, 2-naphthol, naphthylacetic acid, 1-hydroxy-2-naphthalenecarboxylic acid, 3-hydroxy-2-naphthalenecarboxylic acid, 3,7-dihydroxy-2-naphthalenecarboxylic acid, 6-bromo-2-hydroxynaphthalene, 2,6-naphthalenedicarboxylic acid, 9-anthracenecarboxylic acid, 10-bromo-9-anthracenecarboxylic acid, anthracene-9,10-dicarboxylic acid, 1-anthracenecarboxylic acid, 1-hydroxyanthracene, 1,2,3,-anthracenetriol, 9-hydroxymethyl anthracene, 2,7,9-anthracenetriol, benzoic acid, 4-hydroxybenzoic acid, 4-bromobenzoic acid, 3-iodobenzoic acid, 2,4,6-tribromophenol, 2,4,6-tribromoresorcinol, 3,4,5-triiodobenzoic acid, 2,4,6-triiodo-3-aminobenzoic acid, 2,4,6-triiodo-3-hydroxybenzoic acid and 2,4,6-tribromo-3-hydroxybenzoic acid, can be included. When a light-absorbing compound is used, a used amount thereof is, for example, 0.1 to 40% by mass in solid components.

For a rheology controlling agent, for example, phthalate compounds such as dimethyl phthalate, diethyl phthalate, diisobutyl phthalate, dihexyl phthalate, butyl isodecyl phthalate; adipate compounds such as di-normalbutyl adipate, diisobutyl adipate, di-isooctyl adipate, octyl decyl adipate; maleate compounds such as di-normalbutyl maleate, diethyl maleate, dinonyl maleate; oleate compounds such as methyl oleate, butyl oleate, tetrahydro furfuryl oleate; and stearate compounds such as normalbutyl stearate and glyceryl stearate, can be included. When a rheology controlling agent is used, a used amount thereof is, for example, 0.001 to 10% by mass in solid components.

For a surfactant, for example, nonionic surfactants such as, polyoxyethylene alkyl ethers such as polyoxyethylene lauryl ether, polyoxyethylene stearyl ether, polyoxyethylene cetyl ether and polyoxyethylene oleyl ether; polyoxyethylene alkylaryl ethers such as polyoxyethylene octylphenol ether and polyoxyethylene nonylphenol ether; polyoxyethylene-polyoxypropylene block copolymers; sorbitan fatty acid esters such as, sorbitan monolaurate, sorbitan monopalmitate, sorbitan monostearate, sorbitan monooleate, sorbitan trioleate and sorbitan tristearate; polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate; fluorinated surfactants such as Eftop (trade name) EF301, EF303, EF352 (manufactured by JEMCO Inc.), Megafac (trade name) F171, F173, R-08, R-30 (manufactured by DIC Corporation), Fluorad FC430, FC431 (manufactured by Sumitomo 3M Limited), AsahiGuard AG710, Surflon S-382, SC101, SC102, SC103, SC104, SC105, SC106 (trade name) (manufactured by AGC SEIMI CHEMICAL CO., LTD.); and an organosiloxane polymer KP341 (manufactured by Shin-Etsu Chemical Co., Ltd.), can be included. These surfactants may be used singly or in combination of two or more types thereof. When a surfactant is used, a used amount thereof is, for example, 0.0001 to 5% by mass in solid components.

As solvents used for a composition for forming a resist underlayer film according to the present invention, solvents can be used without specific limitation as long as that the above-described solid components can be dissolved. As such solvents, for example, ethylene glycol monomethyl ether, ethylene glycol monoethyl ether, methyl cellosolve acetate, ethyl cellosolve acetate, di ethylene glycol mono methyl ether, di ethylene glycol mono ethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxy propionate, ethyl 2-hydroxy-2-methyl propionate, ethyl ethoxy acetate, ethyl hydroxyacetate, methyl 2-hydroxy-3-methyl butanoate, methyl 3-methoxy propionate, ethyl 3-methoxy propionate, ethyl 3-ethoxy propionate, methyl 3-ethoxy propionate, methyl pyruvate, ethyl pyruvate, ethyl acetate, butyl acetate, ethyl lactate and butyl lactate, can be included. These solvents can be used singly or in combination of two or more types thereof. In addition, a high boiling point solvent such as propylene glycol monobutyl ether and propylene glycol monobutyl ether acetate, can be mixed and used.

Use of a composition for forming a resist underlayer film according to the present invention will be described below.

On a semiconductor substrate (for example, a silicon/silicon dioxide coated substrate, a silicon nitride substrate, a glass substrate and an ITO substrate), the composition for forming a resist underlayer film according to the present invention is applied by adequate applying methods such as a spinner and a coater, and then a resist underlayer film is formed by burning. Burning condition is properly selected from a burning temperature of 80° C. to 250° C. and a burning time of 0.3 to 60 min. Preferably, a burning temperature is 130° C. to 250° C. and a burning time is 0.5 to 5 min. A thickness of a resist underlayer film formed here is, for example, 0.01 to 3.0 µm, preferably, for example, 0.03 to 1.0 µm, 0.03 to 0.5 µm or, 0.05 to 0.2 µm.

Then, a photoresist layer is formed on a resist underlayer film according to the present invention. Forming of the photoresist layer can be performed by known methods, that is, applying a photoresist composition solution on the resist underlayer film and burning.

As a photoresist to be applied and to be formed on a resist underlayer film according to the present invention, a photoresist has no particular limitation as long as it is photosensitive to exposure light. Any of a negative type photoresist and a positive type photoresist can be used. Photoresists include a positive type photoresist composed of a novolac resin and 1,2-naphthoquinone diazide sulfonic acid ester; a chemical amplification type photoresist composed of a binder having groups which decompose by acid to increase rate of dissolution in alkaline and a photo-acid-generating agent; a chemical amplification type photoresist composed of a low molecular compound which decomposes by acid to increase rate of photoresist dissolution in alkaline, an alkaline soluble binder, and a photo-acid-generating agent; a chemical amplification type photoresist composed of a binder having groups which decompose by acid to increase rate of dissolution in alkaline, a low molecular compound which decomposes by acid to increase rate of photoresist dissolution in alkaline and a photo-acid-generating agent; and the like. In addition, for example, a fluorine atom-containing polymer type photoresist described in Proc. SPIE, Vol. 3999, 330-334 (2000), Proc. SPIE, Vol. 3999, 357-364 (2000), and Proc. SPIE, Vol. 3999, 365-374 (2000), can be included.

Next, exposure is performed through a predetermined mask. For exposure, KrF excimer laser (a wave length of 248 nm), ArF excimer laser (a wavelength of 193 nm) and F2 excimer laser (a wave length of 157 nm) and the like can be used. After exposure, post exposure bake (PEB) can also be performed, as necessary. Post exposure heating condition is properly selected from a heating temperature of 70° C. to 150° C. and a heating time of 0.3 to 10 min.

Then, development is performed using developing solution. By this operation, for example, when a positive type photoresist is used, exposed part of photoresist is removed to form a photoresist pattern.

For developing solutions, aqueous solutions of alkali metal hydroxides such as potassium hydroxide and sodium hydroxide; aqueous solutions of quaternary ammonium hydroxides such as tetramethylammonium hydroxide, tetraethylammonium hydroxide and choline; alkaline aqueous solutions such as aqueous solutions of amines such as ethanolamine, propylamine, ethylenediamine; and the like can be included as examples. In addition, a surfactant and the like can be added to these developing solutions. As developing conditions, a temperature and a time are properly selected from 5 to 50° C. and 10 to 300 sec, respectively.

Then, removal of a resist underlayer film and process of a semiconductor substrate are performed by using a photoresist pattern formed as described above as a protective film. Removal of the resist underlayer film is performed by using gasses such as tetrafluoromethane, perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride and chlorine trifluoride.

A planarization film or a gap filling material layer may also be formed before forming a resist underlayer film according to the present invention on a semiconductor substrate. When a semiconductor substrate having large bumps or holes is used, it is preferable that a planarization film or a gap filling material layer is formed.

In addition, a semiconductor substrate applied with a composition for forming a resist underlayer film according to the present invention may be a substrate having an inorganic resist underlayer film formed on its surface by a CVD method or the like, and a resist underlayer film according to the present invention may also be formed thereon.

Moreover, a resist underlayer film according to the present invention can be used for a layer for preventing interaction between a substrate and a photoresist; a layer having a function preventing adverse affection of a material used for a photoresist or a substance generated at the time of exposure to a photoresist, to a substrate; a layer having a function preventing diffusion of a substance generated from a substrate at the time of heating and burning to an upper photoresist layer; a barrier layer to reduce a poisoning effect of a photoresist layer by a dielectric layer of a semiconductor substrate; and the like.

In addition, a resist underlayer film formed from a composition for forming a resist underlayer film is applied to a substrate in which via holes used in a dual damascene process are formed, and can be used as a filling material which can fill up holes without gap. Moreover, the resist underlayer film can also be used as a planarization material (a gap-filling material) for flattening a semiconductor substrate having a rugged surface.

The present invention will be more specifically described below by examples. However, the present invention is not limited by this description.

EXAMPLES

Synthetic Example 1

After 10.0 g of monoallyldiglycidyl isocyanuric acid, 5.4 g of tartaric acid and 0.7 g of triphenylmonoethylphosphonium bromide as a catalyst were dissolved in 37.5 g of propylene glycol monomethyl ether, the reaction solution was heated to 120° C., and stirred for 24 hours under nitrogen atmosphere. When the obtained reaction product was analyzed by GPC, its weight average molecular weight was 6900 as standard polystyrene conversion.

Synthetic Example 2

After 10.0 g of monoallyldiglycidyl isocyanuric acid, 4.8 g of malic acid and 0.7 g of triphenylmonoethylphosphonium bromide as a catalyst were dissolved in 36.1 g of propylene glycol monomethyl ether, the reaction solution was heated to 120° C., and stirred for 24 hours under nitrogen atmosphere. When the obtained reaction product was analyzed by GPC, its weight average molecular weight was 4000 as standard polystyrene conversion.

Synthetic Example 3

After 10.0 g of monoallyldiglycidyl isocyanuric acid, 6.6 g of hydroxyisophthalic acid and 0.4 g of monobenzyltriethylammonium chloride as a catalyst were dissolved in 39.6 g of propylene glycol monomethyl ether, the reaction solution was heated to 120° C., and stirred for 24 hours under nitrogen atmosphere. When the obtained reaction product was analyzed by GPC, its weight average molecular weight was 13,700 as standard polystyrene conversion.

Synthetic Example 4

After 7.0 g of diglycidyl terephthalate, 3.8 g of tartaric acid and 0.5 g of triphenylmonoethylphosphonium bromide as a catalyst were dissolved in 26.2 g of propylene glycol monomethyl ether, the reaction solution was heated to 120° C., and stirred for 24 hours under nitrogen atmosphere. When the obtained reaction product was analyzed by GPC, its weight average molecular weight was 6600 as standard polystyrene conversion.

Synthetic Example 5

After 7.0 g of 1,4-butyldiol diglycidyl ether, 5.4 g of tartaric acid and 0.7 g of triphenylmonoethylphosphonium bromide as a catalyst were dissolved in 30.4 g of propylene glycol monomethyl ether, the reaction solution was heated to 120° C., and stirred for 24 hours under nitrogen atmosphere. When the obtained reaction product was analyzed by GPC, its weight average molecular weight was 3200 as standard polystyrene conversion.

Synthetic Example 6

After 10.0 g of monoallyldiglycidyl isocyanuric acid, 4.3 g of succinic acid and 0.6 g of triphenylmonoethylphosphonium bromide as a catalyst were dissolved in 34.7 g of propylene glycol monomethyl ether, the reaction solution was heated to 120° C., and stirred for 24 hours under nitrogen atmosphere. When the obtained reaction product was analyzed by GPC, its weight average molecular weight was 7300 as standard polystyrene conversion.

Synthetic Example 7

After 5.0 g of monoallyldiglycidyl isocyanuric acid, 3.0 g of phthalic acid and 0.2 g of monophenyltriethylammonium chloride as a catalyst were dissolved in 19.1 g of propylene glycol monomethyl ether, the reaction solution was heated to 120° C., and stirred for 24 hours under nitrogen atmosphere. When the obtained reaction product was analyzed by GPC, its weight average molecular weight was 1800 as standard polystyrene conversion.

Example 1

Each 0.5 g of tetramethoxymethyl glycoluril (manufactured by MT AquaPolymer, Inc., trade name: Powderlink 1174), 0.05 g of pyridinium-p-toluenesulfonate, 23 g of propylene glycol monomethyl ether and 31 g of propylene glycol monomethyl ether acetate were added to 10 g of solution containing 2 g of the polymer obtained in Synthetic Example 1 to make the solution. Thereafter, the solution was filtered using a micro-filter made of polyethylene having a pore diameter of 0.10 μm, and then was further filtered using a micro-filter made of polyethylene having a pore diameter of 0.05 μm to prepare the solution of a composition for forming a resist underlayer film.

Example 2

Preparation was performed in a similar way to Example 1 other than using the polymer obtained in Synthetic Example 2 instead of the polymer obtained in Synthetic Example 1.

Example 3

Preparation was performed in a similar way to Example 1 other than using the polymer obtained in Synthetic Example 3 instead of the polymer obtained in Synthetic Example 1.

Example 4

Preparation was performed in a similar way to Example 1 other than using the polymer obtained in Synthetic Example 4 instead of the polymer obtained in Synthetic Example 1.

Example 5

Preparation was performed in a similar way to Example 1 other than using the polymer obtained in Synthetic Example 5 instead of the polymer obtained in Synthetic Example 1.

Comparative Example 1

Each 0.5 g of tetramethoxymethyl glycoluril (manufactured by MT AquaPolymer, Inc., trade name: Powderlink 1174), 0.05 g of 5-sulfosalicylic acid, 23 g of propylene glycol monomethyl ether and 31 g of propylene glycol monomethyl ether acetate were added to 10 g of solution containing 2 g of the polymer obtained in Synthetic Example 6 to make the solution. Thereafter, the solution was filtered using a micro-filter made of polyethylene having a pore diameter of 0.10 μm, and then was further filtered using a micro-filter made of polyethylene having a pore diameter of 0.05 μm to prepare the solution of a composition for forming a resist underlayer film.

Comparative Example 2

Preparation was performed in a similar way to Comparative Example 1 other than using the polymer obtained in Synthetic Example 7 instead of the polymer obtained in Synthetic Example 6.

(Dissolution Test into a Photoresist Solvent)

Solutions of the compositions for forming a resist underlayer film prepared in Examples 1 to 5 and Comparative Examples 1 and 2 were applied on each semiconductor substrate (silicon wafer) by a spinner. Each sample was burned on a hot plate at 205° C. for 1 min to form a resist underlayer film (a film thickness of 0.10 μm). This resist underlayer film was immersed into a solvent used for photoresists (ethyl lactate and propylene glycol monomethyl ether acetate) and it was confirmed that the resist underlayer film is insoluble to the solvent.

(Test for Optical Parameter)

Solutions of compositions for forming a resist underlayer film prepared in Examples 1 to 5 and Comparative Examples 1 and 2 were applied on each silicon wafer by a spinner. Each sample was burned on a hot plate at 205° C. for 1 min to form a resist underlayer film (a thickness of 0.06 μm). Then, refractive indices (n values) and attenuation coefficients (k values) of these resist underlayer films were measured at a wavelength of 193 nm by using a spectroscopic ellipsometer (manufactured by J. A. Woollam Co., Inc., VUV-VASE VU-302). The results were listed in Table 1.

(Measurement of Dry Etching Rate)

Solutions of compositions for forming a resist underlayer film prepared in Examples 1 to 5 and Comparative Examples 1 and 2 were applied on each silicon wafer by a spinner. Each sample was burned on a hot plate at 205° C. for 1 min to form a resist underlayer film. Then, dry etching rate (decreasing amount of thickness in unit time) was measured by using RIE System ES401 (manufactured by Nippon Scientific Co., Ltd.) under conditions of using $CF_4$ as a dry etching gas.

In addition, a photoresist solution (manufactured by Sumitomo Chemical Co., Ltd., trade name: PAR710) was applied in a similar way on a silicon wafer by a spinner, and the coated wafer was heated on a hot plate at 90° C. for 1 min to form a photoresist layer. Then, dry etching rate was measured by using RIE System ES401 (manufactured by Nippon Scientific Co., Ltd.) under conditions of using $CF_4$ as a dry etching gas.

Dry etching rates of resist underlayer films formed in Examples 1 to 5 and Comparative Example 1 and 2 were compared with that of the photoresist PAR710 manufactured by Sumitomo Chemical Co., Ltd. The result was listed in Table 1. In Table 1, etching rates of resist underlayer films formed from each Example and Comparative Example were represented, when the dry etching rate of the photoresist PAR710 was defined as 1.00.

TABLE 1

| | n value | k value | Selectivity ratio |
|---|---|---|---|
| Example 1 | 1.86 | 0.21 | 2.28 |
| Example 2 | 1.85 | 0.23 | 2.10 |
| Example 3 | 1.77 | 0.33 | 1.92 |
| Example 4 | 1.63 | 0.32 | 1.88 |
| Example 5 | 1.68 | 0.05 | 1.88 |
| Comparative Example 1 | 1.87 | 0.21 | 1.82 |
| Comparative Example 2 | 1.57 | 0.35 | 1.54 |

From this result, it was found that the resist underlayer films obtained from compositions for forming a resist underlayer film according to the present invention had sufficiently effective refractive indices and attenuation coefficients of the light having 193 nm wavelength. In addition, it was found that the resist underlayer films had high dry etching rate selectivity to the photoresist. Accordingly, it can be said that time needed for removal of a resist underlayer film by dry etching can be shortened, and undesirable phenomena of reducing film thickness of a photoresist layer with removal of a resist underlayer film by dry etching can be suppressed.

(Evaluation of Photoresist Pattern Shape)

The solution of the composition for forming a resist underlayer film prepared in Example 1 was applied on a silicon wafer, on which 50 nm of SiON film (as an optical constant at 193 nm, n/k=1.75/0.87) is formed, by a spinner. The sample was burned on a hot plate at 205° C. for 1 min to form a resist underlayer film having 80 nm thickness. The commercially available photoresist solution of AR1221J (trade name) manufactured by JSR Corporation was applied on this resist underlayer film by a spinner, and the obtained sample was heated on a hot plate at 130° C. for 90 sec to form a photoresist film (a film thickness of 0.25 μm). Then, after development, the obtained sample was exposed through a mask which was set so as to form nine lines of photoresist that had a line width and a width between the lines being 0.09 μm, that is 0.08 μmL/S (dense line), using PAS5500/1100 scanner manufactured by ASML Holding N.V. (a wavelength of 193 nm, NA, a: 0.75, 0.89/0.55 (ANNULAR)). Thereafter, post exposure heating was preformed on a hot plate at 130° C. for 90 sec. After cooling, the sample was developed with 0.26 N tetramethylammonium hydroxide aqueous solution as developing solution according to 60-second single paddle process based on an industrial standards.

A cross-sectional surface of the obtained photoresist pattern was observed with a scanning electron microscope (SEM). As a result, it was observed that every shape of the obtained photoresist pattern had good straight skirt shape.

Moreover, a focus depth margin was determined as follows. That is, the above-described exposure was performed with moving focus position in every 0.1 μm in up and down directions from the optimum focus position as reference position, and then a resist pattern was formed by development treatment. When five or more photoresist lines were formed among nine photoresist lines which should be formed, the sample passed the evaluation, and when remaining lines were four or less, the sample failed. A range of interval between upper and lower focus position where the sample can obtain the passing result was defined as a focus depth margin. As a result, when the compositions for forming a resist underlayer film obtained in Examples 1 to 5 were used, every focus depth margin was 0.7 or more.

Example 6

38 g of propylene glycol monomethyl ether was added to 10 g of solution containing 2 g of the polymer obtained in Synthetic Example 1 to make the solution. Thereafter, the solution was filtered using a micro-filter made of polyethylene having a pore diameter of 0.10 μm, and then was further filtered using a micro-filter made of polyethylene having a pore diameter of 0.05 μm to prepare the solution of a composition for forming a resist underlayer film containing only the polymer.

Example 7

Preparation was performed in a similar way to Example 6 other than using the polymer obtained in Synthetic Example 3 instead of the polymer obtained in Synthetic Example 1, and a composition for forming a resist underlayer film was obtained.

Example 8

Preparation was performed in a similar way to Example 6 other than using the polymer obtained in Synthetic Example 4 instead of the polymer obtained in Synthetic Example 1, and a composition for forming a resist underlayer film was obtained.

Example 9

Preparation was performed in a similar way to Example 6 other than using the polymer obtained in Synthetic Example 5 instead of the polymer obtained in Synthetic Example 1, and a composition for forming a resist underlayer film was obtained.

Comparative Example 3

38 g of propylene glycol monomethyl ether was added to 10 g of solution containing 2 g of the polymer obtained in Synthetic Example 6 to make the solution. Thereafter, the solution was filtered using a micro-filter made of polyethylene having a pore diameter of 0.10 μm, and then was further filtered using a micro-filter made of polyethylene having a pore diameter of 0.05 μm to prepare the solution of a composition for forming a resist underlayer film containing only the polymer.

Comparative Example 4

Preparation was performed in a similar way to Comparative Example 3 other than using the polymer obtained in Synthetic Example 7 instead of the polymer obtained in Synthetic Example 6, and a composition for forming a resist underlayer film was obtained.

(Dissolution Test of a Resist Underlayer Film Formed from Only the Polymer into a Photoresist Solvent)

The solutions of the composition for forming a resist underlayer film prepared in Examples 5 to 9 and Comparative Examples 3 and 4 were applied on semiconductor substrates (silicon wafers) by a spinner and their thickness was adjusted to 100 nm. The obtained samples were burned on a hot plate at 205° C. for 1 min to form resist underlayer films (a film thickness of 0.10 μm). These resist underlayer films were immersed into a solvent used for a photoresist (propylene glycol monomethyl ether acetate), and after spin drying, these samples were burned at 100° C. for 30 sec to remove solvent. By the film thickness of before and after this treatment, dissolution property was determined. The result was listed in Table 2. The unit of the film thickness in Table 2 is nm.

TABLE 2

|  | Before immersion | After immersion | Dissolution amount |
|---|---|---|---|
| Example 6 | 99 | 97 | 3 |
| Example 7 | 100 | 77 | 23 |
| Example 8 | 99 | 90 | 9 |
| Example 9 | 100 | 47 | 53 |
| Comparative Example 3 | 100 | 4 | 96 |
| Comparative Example 4 | 100 | 1 | 99 |

From this result, it became evident that the resist underlayer film formed from the composition for forming the resist underlayer film containing only the polymer according to the present invention had effect for preventing mixing with a resist solvent even though the film did not contain a crosslinking agent. Particularly for the polymer obtained in Example 6, it became evident that the resist underlayer film caused no mixing even though the film did not contain a crosslinking agent at all. Accordingly, a crosslinkable compound, and an acid compound and an acid-generating agent to cause crosslink to a polymer with the crosslinkable compound do not need to be contained.

A crosslinkable compound, an acid compound and an acid-generating agent are low molecular compounds, a part of a composition for forming a resist underlayer film containing these compounds is flown away as a sublimate and then attached to inside of a chamber when the composition for forming a resist underlayer film is applied to a substrate to form a resist underlayer film by heating and curing, and the attached substance is dropped on the substrate when it is cooled, so that the dropped substance becomes a foreign matter to cause a problem in some cases. However, as described above, a resist underlayer film which does not cause mixing with overcoated photoresist solution without containing a crosslinkable compound, an acid compound and an acid-generating agent can solve the problem being caused by the above-described foreign matter.

INDUSTRIAL APPLICABILITY

In a lithographic process of semiconductor equipment manufacturing, the present invention is utilizable to a lithographic resist underlayer film and a composition for forming a resist underlayer film for forming the underlayer film being usable as, a lower-layer antireflection film by which an exposure light, in particular ArF excimer laser (a wavelength of 193 nm), striking on a photoresist formed on a semiconductor substrate is inhibited from being reflected from the substrate; a planarization film for flattening a semiconductor substrate having a rugged surface; and a film which prevents a photoresist from being contaminated by a substance generated from a semiconductor substrate during heating/burning; or the like.

The invention claimed is:

1. A resist underlayer film located between a substrate and a photoresist film, wherein the resist underlayer film comprises a lithographic composition comprising:

a polymer having a structure represented by formula (2):

[Chemical Formula 2]

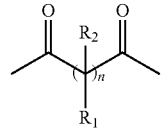

(2)

where n represents a number of repeating unit(s) of 1 to 10, each $R_1$ and $R_2$ is a functional group selected from a group consisting of a hydroxyl group, a hydrogen atom, a $C_{1-6}$ alkyl group, a phenyl group, a naphthyl group, a nitro group, a cyano group, and a halogen group, and a total number of hydroxyl groups of $R_1$ and $R_2$ is 1 or more and 2n or less; and a solvent.

2. The resist underlayer film located between a substrate and a photoresist film according to claim 1, wherein the lithographic composition further comprises underlayer film according to claim 1, further comprising an acid compound and/or an acid-generating agent.

3. A resist underlayer film located between a substrate and a photoresist film, wherein the resist underlayer film comprises a lithographic composition comprising:

a polymer having a structure represented by formula (4):

[Chemical Formula 4]

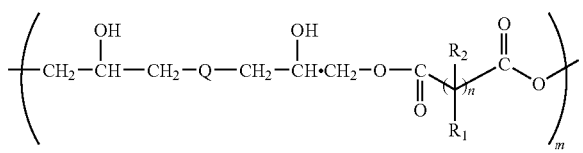

(4)

where n represents a number of repeating unit(s) of 1 to 10, each $R_1$ and $R_2$ is a functional group selected from a group consisting of a hydroxyl group, a hydrogen atom, a $C_{1-6}$ alkyl group, a phenyl group, a naphthyl group, a nitro group, a cyano group, and a halogen group, a total number of hydroxyl groups of $R_1$ and $R_2$ is 1 or more and 2n or less, m represents a number of repeating units of 3 to 1000, and Q represents formula (5), formula (6), formula (7), formula (8), formula (9), or formula (10):

[Chemical Formula 5]

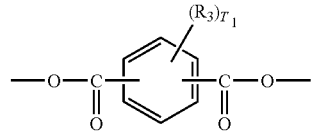

(5)

-continued (6)

[Structure: —O—C(=O)—cyclohexane with (R₃)_{T₂}—C(=O)—O—]

(7)

[Structure: —O—C(=O)—naphthalene with (R₃)_{T₃}—C(=O)—O—]

(8)

[Structure: —O—C(=O)—anthracene with (R₃)_{T₄}—C(=O)—O—]

(9)

—O—(CH₂)_k—O—

(10)

[Structure: hydantoin ring with N—X₁]

$R_3$ is a substitution group of a ring and each $R_3$ is a $C_{1-6}$ alkyl group, a $C_{1-6}$ alkoxy group, a $C_{3-6}$ alkenyl group, a halogen group, a nitro group, a cyano group, a hydroxyl group or a $C_{1-6}$ alkylthio group, $T_1$ is an integer of 1 to 4,
$T_2$ is an integer of 1 to 10,

[Chemical Formula 8]

$T_3$ is an integer of 1 to 6,
$T_4$ is an integer of 1 to 8,
k is an integer of 1 to 10, and
$X_1$ represents formula (11), formula (12) or formula (13):

[Chemical Formula 6]

(11)

[Structure: —C(R₄)(R₅)—]

(12)

[Structure: —C(R₆)(R₇)—C(=O)—]

(13)

[Structure: —N(R₈)—C(=O)—]

where each $R_4$ to $R_7$ represents a hydrogen atom, a $C_{1-6}$ alkyl group, a $C_{3-6}$ alkenyl group, a benzyl group, or a phenyl group, the phenyl group may be substituted with a group selected from a group consisting of a $C_{1-6}$ alkyl group, a halogen atom, a $C_{1-6}$ alkoxy group, a nitro group, a cyano group, a hydroxyl group and a $C_{1-6}$ alkylthio group, $R_4$ and $R_5$ and $R_6$ and $R_7$ may be bonded to each other to form a $C_{3-6}$ ring, $R_8$ represents a hydrogen atom, a $C_{1-6}$ alkyl group, a $C_{3-6}$ alkenyl group, a benzyl group, or a phenyl group, the phenyl group may be substituted with a group selected from a group consisting of a $C_{1-6}$ alkyl group, a halogen atom, a $C_{1-6}$ alkoxy group, a nitro group, a cyano group, a hydroxyl group and a $C_{1-6}$ alkylthio group, and a solvent.

4. The resist underlayer film located between a substrate and a photoresist film according to claim 3, wherein the lithographic composition further comprises underlayer film according to claim 4, further comprising an acid compound and/or an acid-generating agent.

5. A lithographic composition for forming a resist underlayer film comprising:

a polymer having a structure represented by formula (15):

(15)

[Structure: polymer with triazine ring bearing allyl group, bonded to —CH₂—CH(OH)—CH₂—N and N—CH₂—CH(OH)·CH₂—O—C(=O)—CH(OH)—CH(OH)—C(=O)—O— repeating unit m]

where m represents a number of repeating units of 3 to 1000, and a solvent.

6. The lithographic composition for forming a resist underlayer film according to claim 5, further comprising an acid compound and/or an acid-generating agent.

7. A resist underlayer film located between a substrate and a photoresist film, wherein the resist underlayer film comprises a lithographic composition comprising:

a polymer having a structure represented by formula (16):

[Chemical Formula 9]
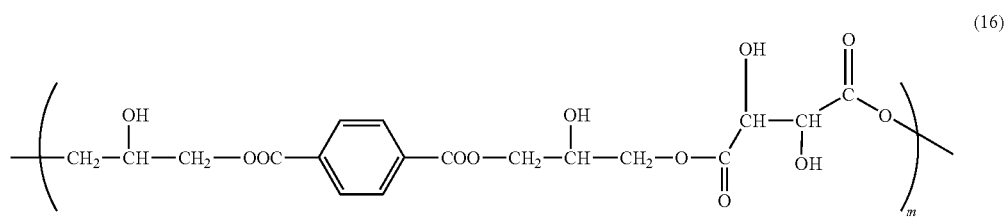
(16)
where m represents a number of repeating units of 3 to 1000, and a solvent.
8. The resist underlayer film located between a substrate and a photoresist film according to claim 7, wherein the lithographic composition further comprises underlayer film according to claim 7, further comprising an acid compound and/or an acid-generating agent.
* * * * *